United States Patent
Gao et al.

(10) Patent No.: US 12,369,373 B2
(45) Date of Patent: Jul. 22, 2025

(54) COMPOSITE SUBSTRATE, COMPOSITE SUBSTRATE PREPARATION METHOD, SEMICONDUCTOR DEVICE, AND ELECTRONIC DEVICE

(71) Applicant: HUAWEI TECHNOLOGIES CO., LTD., Guangdong (CN)

(72) Inventors: Bo Gao, Dongguan (CN); Boning Huang, Dongguan (CN); Yuxi Wan, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/857,468

(22) Filed: Jul. 5, 2022

(65) Prior Publication Data

US 2023/0009774 A1   Jan. 12, 2023

(30) Foreign Application Priority Data

Jul. 6, 2021 (CN) .......................... 202110765400.1

(51) Int. Cl.
    *H10D 62/832*   (2025.01)
    *H01L 21/02*    (2006.01)

(52) U.S. Cl.
    CPC ... *H10D 62/8325* (2025.01); *H01L 21/02447* (2013.01); *H01L 21/02529* (2013.01); *H01L 21/02598* (2013.01); *H01L 21/02694* (2013.01)

(58) Field of Classification Search
    None
    See application file for complete search history.

(56) References Cited

U.S. PATENT DOCUMENTS

| | | | |
|---|---|---|---|
| 2009/0278233 A1 | 11/2009 | Pinnington et al. | |
| 2011/0284871 A1* | 11/2011 | Harada | H01L 29/66068 257/77 |
| 2013/0032822 A1 | 2/2013 | Ishibashi | |
| 2014/0239312 A1 | 8/2014 | Shatalov et al. | |
| 2020/0058542 A1 | 2/2020 | Hu | |
| 2020/0083039 A1 | 3/2020 | Honke et al. | |

FOREIGN PATENT DOCUMENTS

| | | |
|---|---|---|
| CN | 102270644 A | 12/2011 |
| CN | 102664151 A | 9/2012 |
| CN | 104638071 A | 5/2015 |
| CN | 108145307 A | 6/2018 |
| CN | 109686656 A | 4/2019 |

(Continued)

OTHER PUBLICATIONS

Shoji, JP2009117533A, Manufacturing Method of Silicon Carbide Substrate, May 28, 2009. (Year: 2009).*

(Continued)

*Primary Examiner* — Alexander G Ghyka
(74) *Attorney, Agent, or Firm* — Fish & Richardson P.C.

(57) ABSTRACT

Embodiments of this application relate to the field of semiconductor technologies, and provide composite substrate that comprises: a first silicon carbide layer comprising monocrystalline silicon carbide, and a second silicon carbide layer bonded to the first silicon carbide layer, wherein defect density of at least a part of the second silicon carbide layer is greater than defect density of the first silicon carbide layer.

12 Claims, 9 Drawing Sheets

(56) References Cited

FOREIGN PATENT DOCUMENTS

| JP | 2014216555 A | 11/2014 |
|---|---|---|
| KR | 101198357 B1 | 11/2012 |
| WO | 2021092862 A1 | 5/2021 |

OTHER PUBLICATIONS

Makoto et al., WO 9910919A1. Silicon Carbide Substrate, Process for Producing the Same, and Semiconductor Element Containing Silicon Carbide Substrate, Mar. 4, 1999. (Year: 1999).*
Extended European Search Report in European Appln No. 22183215.7, dated Dec. 5, 2022, 9 pages.
EP Communication Pursuant to Article 94(3) EPC in European Appln No. 22183215.7, dated Aug. 31, 2023, 9 pages.
Suga et al., "Silicon carbide wafer bonding by modified surface activated bonding method," Japanese Journal of Applied Physics, Jan. 15, 2015, 54(3):1-5.

\* cited by examiner

COMPOSITE SUBSTRATE, COMPOSITE SUBSTRATE PREPARATION METHOD, SEMICONDUCTOR DEVICE, AND ELECTRONIC DEVICE

CROSS-REFERENCE TO RELATED APPLICATION

This application claims priority to Chinese Patent Application No. 202110765400.1, filed on Jul. 6, 2021, which is hereby incorporated by reference in its entirety.

TECHNICAL FIELD

This application relates to the field of semiconductor technologies, and in particular, to a composite substrate, a composite substrate preparation method, a semiconductor device, and an electronic device.

BACKGROUND

Silicon carbide (SiC) materials feature a wide band gap, high critical breakdown field strength, and high thermal conductivity. Therefore, SiC power devices are resistant to high voltages and high temperatures, and have a fast switching speed and low switching loss, and are widely used in the fields of aeronautics and astronautics, smart grid, rail transportation, new energy power generation, electric vehicles, industrial power supply, and the like.

However, on the one hand, when a SiC crystal grows, due to a limitation on a physical vapor transport (physical vapor transport, PVT) growth manner, a slight fluctuation in a process condition may cause a large quantity of defects in the crystal, and quality of an entire ingot fails to meet a requirement. Consequently, it is difficult to improve a yield of SiC ingots, and a large quantity of low-quality SiC ingots are generated. On the other hand, during the cutting, grinding and polishing process of SiC ingots, a large quantity of substandard SiC wafers may be cut from qualified SiC ingots due to influence of crystal stress.

In this way, due to a limitation on the growth manner and a yield of SiC crystals, manufacturing costs and sales prices of SiC power devices remain high, and promotion and application of SiC power devices in various fields are severely restricted.

SUMMARY

Embodiments of this application provide a composite substrate, a composite substrate preparation method, a semiconductor device, and an electronic device, to resolve a problem of high costs of SiC power devices due to high costs of SiC substrates.

To achieve the foregoing objective, this application uses the following technical solutions.

According to a first aspect, a composite substrate is provided, including: a first silicon carbide layer, where a material of the first silicon carbide layer includes monocrystalline silicon carbide; and a second silicon carbide layer, bonded to the first silicon carbide layer, where defect density of at least a part of the second silicon carbide layer is greater than defect density of the first silicon carbide layer.

The composite substrate provided in this embodiment of this application includes the first silicon carbide layer and the second silicon carbide layer that are disposed in a stacked manner, and the first silicon carbide layer and the second silicon carbide layer belong to a same type of material. Therefore, compared with a composite substrate including a heterogeneous material disposed in a stacked manner, the composite substrate in this embodiment of this application has good electrical conductivity and thermal conductivity, and can meet an epitaxial requirement as a monocrystalline silicon carbide substrate does. In addition, the second silicon carbide layer is a low-quality silicon carbide layer. In other words, the composite substrate in this embodiment of this application can utilize low-quality silicon carbide, improve utilization of the low-quality silicon carbide, and effectively reduce costs of the composite substrate.

In a possible embodiment, the first silicon carbide layer is directly bonded to the second silicon carbide layer. In this way, a distance between the first silicon carbide layer and the second silicon carbide layer is small, and the composite substrate has good electrical conductivity and thermal conductivity.

In a possible embodiment, a thickness of a first bonding layer formed by directly bonding the first silicon carbide layer to the second silicon carbide layer is less than or equal to 5 nm. An excessively thick first bonding layer may affect the electrical conductivity and thermal conductivity of the composite substrate.

In a possible embodiment, the composite substrate further includes a transition layer, the transition layer is located between the first silicon carbide layer and the second silicon carbide layer, and the first silicon carbide layer and the second silicon carbide layer are bonded by using the transition layer. The first silicon carbide layer and the second silicon carbide layer are bonded by using the transition layer, so that bonding effect is good and bonding difficulty is low.

In a possible embodiment, a second bonding layer is formed by bonding the first silicon carbide layer to the transition layer, and a third bonding layer is formed by bonding the second silicon carbide layer to the transition layer. A sum of thicknesses of the transition layer, the second bonding layer, and the third bonding layer is less than or equal to 100 nm. An excessively large sum of thicknesses of the transition layer, the second bonding layer, and the third bonding layer may affect the electrical conductivity and thermal conductivity of the composite substrate.

In a possible embodiment, roughness of a surface of the first silicon carbide layer away from the second silicon carbide layer is less than or equal to 0.5 nm. This facilitates epitaxial growth of an epitaxial layer on a front surface of the first silicon carbide layer.

In a possible embodiment, the material of the first silicon carbide layer includes N-type silicon carbide.

In a possible embodiment, a material of the second silicon carbide layer includes monocrystalline silicon carbide or polycrystalline silicon carbide. Various types of silicon carbide are applicable, so that costs of the composite substrate are reduced.

In a possible embodiment, a thickness of the first silicon carbide layer is less than or equal to 350 μm. This can avoid a waste of resources, and prevent an excessive thickness of the composite substrate.

In a possible embodiment, a thickness of the second silicon carbide layer is less than or equal to 3000 μm. This can avoid a waste of resources, and prevent an excessive thickness of the composite substrate.

According to a second aspect, a composite substrate preparation method is provided, including: performing hydrogen ion implantation on a monocrystalline silicon carbide ingot from a back surface of the monocrystalline silicon carbide ingot, so that an implanted ion reaches a preset depth and forms a defect layer at the preset depth, where a first silicon carbide layer is formed on a side of the defect layer facing the back surface of the monocrystalline silicon carbide ingot; bonding the back surface of the monocrystalline silicon carbide ingot to a front surface of a second silicon carbide layer to form a first composite structure, where defect density of at least a part of the second silicon carbide layer is greater than defect density of the first silicon carbide layer; performing first annealing treatment on the first composite structure, so that the first silicon carbide layer is peeled off along the defect layer to form a second composite structure, where the second composite structure includes the first silicon carbide layer and the second silicon carbide layer that are bonded and a damaged layer separated from the defect layer; performing surface treatment on a surface of the first silicon carbide layer away from the second silicon carbide layer, to remove the damaged layer, and to form a third composite structure; and performing second annealing treatment on the third composite structure to repair a defect caused by hydrogen ion implantation in the first silicon carbide layer, and to form the composite substrate, where an annealing temperature of the second annealing treatment is greater than an annealing temperature of the first annealing treatment.

According to the composite substrate preparation method provided in this embodiment of this application, hydrogen ion implantation is performed on the high-quality monocrystalline silicon carbide ingot to form the implanted defect layer, and then the implanted defect layer is bonded to the low-quality second silicon carbide layer. Under an action of high temperature annealing on a bonded composite structure, the composite structure including the low-quality second silicon carbide layer and the high-quality first silicon carbide layer and a high-quality remaining monocrystalline silicon carbide ingot are formed. After being polished, the remaining monocrystalline silicon carbide ingot may be reused as a monocrystalline silicon carbide ingot. The composite structure may be used as a composite substrate for epitaxial use after surface polishing and high temperature annealing. In this way, the composite substrate obtained according to the composite substrate preparation method provided in this embodiment of this application includes the first silicon carbide layer and the second silicon carbide layer that are disposed in a stacked manner, and the first silicon carbide layer and the second silicon carbide layer belong to a same type of material. Therefore, compared with a composite substrate including a heterogeneous material disposed in a stacked manner, the composite substrate in this embodiment of this application has good electrical conductivity and thermal conductivity, and can meet an epitaxial requirement as a monocrystalline silicon carbide substrate does. In addition, the high-quality monocrystalline silicon carbide ingot is cut in a hydrogen ion implantation manner, which can effectively reduce a cutting loss and improve a yield rate and cutting efficiency. Therefore, according to the composite substrate preparation method provided in this embodiment of this application, utilization of the high-quality silicon carbide ingot can be improved, and preparation costs of the composite substrate can be effectively reduced. The second silicon carbide layer in the composite substrate is a low-quality silicon carbide layer. In other words, the composite substrate in this embodiment of this application can utilize low-quality silicon carbide, and improve utilization of the low-quality silicon carbide. Therefore, the composite substrate provided in this embodiment of this application can utilize both high-quality silicon carbide and the low-quality silicon carbide, greatly improve overall utilization of silicon carbide, and effectively reduce costs of the composite substrate.

In a possible embodiment, before the performing second annealing treatment on the third composite structure, the preparation method further includes: forming a carbon protective film on the surface of the first silicon carbide layer away from the second silicon carbide layer. After the performing the second annealing treatment on the third composite structure, the preparation method further includes: removing the carbon protective film. Forming the carbon protective film on the surface of the first silicon carbide layer away from the second silicon carbide layer can avoid carbon evaporation and silicon precipitation in the first silicon carbide layer due to an excessively high temperature in a subsequent high temperature annealing process, and prevent the surface of the first silicon carbide layer away from the second silicon carbide layer from being roughened.

In a possible embodiment, the bonding the back surface of the monocrystalline silicon carbide ingot to a front surface of a second silicon carbide layer includes: forming a transition layer on the back surface of the monocrystalline silicon carbide ingot or the front surface of the second silicon carbide layer; and bonding the back surface of the monocrystalline silicon carbide ingot to the front surface of the second silicon carbide layer by using the transition layer. The composite substrate further includes the transition layer located between the first silicon carbide layer and the second silicon carbide layer.

In a possible embodiment, the bonding the back surface of the monocrystalline silicon carbide ingot to a front surface of a second silicon carbide layer includes: directly bonding the back surface of the monocrystalline silicon carbide ingot to the front surface of the second silicon carbide layer.

In a possible embodiment, a lattice direction of the monocrystalline silicon carbide ingot is deflected in a range greater than or equal to 0° and less than or equal to 8° from a <0001> lattice direction. In this way, a lattice direction of the first silicon carbide layer obtained by using the monocrystalline silicon carbide ingot is also deflected in the range greater than or equal to 0° and less than or equal to 8° from the <0001> lattice direction, so that defect density of subsequent epitaxial growth on a surface of the first silicon carbide layer can be reduced.

In a possible embodiment, energy of hydrogen ion implantation is greater than or equal to 100 keV, a dose of hydrogen ion implantation is greater than or equal to 1e16 $cm^{-2}$, and an angle of hydrogen ion implantation is in a range greater than or equal to 5° and less than or equal to 45°. In this way, the formed defect layer may be a complete flat layer structure.

In a possible embodiment, the performing surface treatment on a surface of the first silicon carbide layer away from the second silicon carbide layer, to remove the damaged layer includes: performing treatment the surface of the first silicon carbide layer away from the second silicon carbide layer by using at least one of wet cleaning, plasma activation, high temperature annealing, chemical mechanical polishing, mechanical polishing, reactive ion etching, ion beam etching, or ion beam grazing-incidence polishing, to remove the damaged layer.

In a possible embodiment, before the bonding the back surface of the monocrystalline silicon carbide ingot to a front surface of a second silicon carbide layer, the preparation method further includes: performing surface treatment on the back surface of the monocrystalline silicon carbide ingot, so that roughness of the back surface of the monocrystalline silicon carbide ingot is less than or equal to 0.5 nm. This can avoid excessively small bonding force caused by excessive roughness of the back surface of the monocrystalline silicon carbide ingot, and prevent affecting a bonding effect between the monocrystalline silicon carbide ingot and the second silicon carbide layer.

In a possible embodiment, before the bonding the back surface of the monocrystalline silicon carbide ingot to a front surface of a second silicon carbide layer, the preparation method further includes: performing surface treatment on the front surface of the second silicon carbide layer, so that roughness of the front surface of the second silicon carbide layer is less than or equal to 0.5 nm. This can avoid excessively small bonding force caused by excessive roughness of the front surface of the second silicon carbide layer, and prevent affecting a bonding effect between the monocrystalline silicon carbide ingot and the second silicon carbide layer.

In a possible embodiment, the annealing temperature of the first annealing treatment is greater than or equal to 1000° C., and the annealing temperature of the second annealing treatment is greater than or equal to 1200° C.

In a possible embodiment, an annealing environment for the first annealing treatment is at least one of $N_2$, Ar, or $H_2$, and an annealing environment for the second annealing treatment is at least one of vacuum, $N_2$, Ar, or C-containing gas.

According to a third aspect, a semiconductor device is provided, including the composite substrate according to any one of the first aspect and embodiments of the first aspect and a switch functional assembly. The switch functional assembly is disposed on the composite substrate.

According to a fourth aspect, an electronic device is provided, including the semiconductor device according to the third aspect and a printed circuit board. The printed circuit board is disposed close to a composite substrate of the semiconductor device, and is electrically connected to the semiconductor device.

REFERENCE NUMERALS

Figure 1:
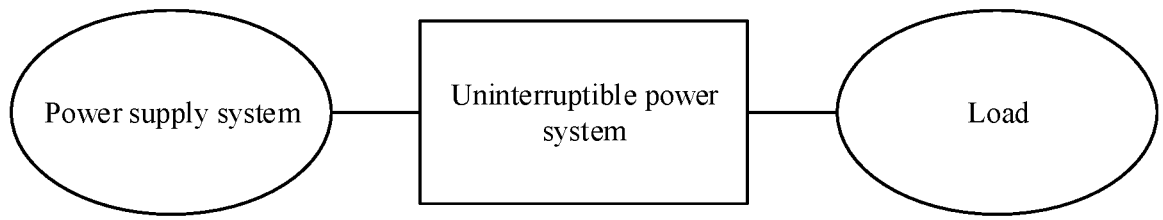
FIG. 1 is a diagram of an application scenario of an uninterruptible power system according to an embodiment of this application.

1—substrate; 2—semiconductor layer; 3—well region; 4—source region; 5—contact region; 6—insulating film; 7—interlayer insulating film; 10—monocrystalline silicon carbide ingot, 11—first silicon carbide layer; 12—remaining monocrystalline silicon carbide ingot, 20—defect layer; 21—damaged layer; 30—second silicon carbide layer, 41—first bonding layer; 42—transition layer; 43—second bonding layer; 44—third bonding layer; 50—carbon protective film; Q1—first composite structure; Q2—second composite structure; and Q3—third composite structure.

DESCRIPTION OF EMBODIMENTS

The following describes technical solutions in embodiments of this application with reference to accompanying drawings in embodiments of this application. It is clear that the described embodiments are merely some but not all of embodiments of this application.

The following terms "first" and "second" are merely intended for ease of description, and shall not be understood as an indication or implication of relative importance or implicit indication of a quantity of indicated technical features. Therefore, a feature limited by "first", "second", or the like may explicitly or implicitly include one or more features. In descriptions of this application, unless otherwise stated, "a plurality of" means two or more than two.

In embodiments of this application, unless otherwise specified and limited, the term "electrical connection" may be a direct electrical connection, or may be an indirect electrical connection through an intermediate dielectric.

In embodiments of this application, the word "example", "for example", or the like is used to represent giving an example, an illustration, or a description. Any embodiment or design scheme described as an "example" or with "for example" in embodiments of this application should not be explained as being more preferred or having more advantages than another embodiment or design scheme. Exactly, use of the word "example", "for example" or the like is intended to present a relative concept in a specific manner.

In embodiments of this application, the term "and/or" describes an association relationship between associated objects and may indicate three relationships. For example, A and/or B may indicate the following cases: Only A exists, both A and B exist, and only B exists, where A and B may be singular or plural. The character "l" generally represents an "or" relationship between the associated objects.

In embodiments of this application, for example, "upper", "lower", "left", "right", "front", and "rear" are used to explain that structures and motion directions of different components in this application are relative. These indications are appropriate when the components are in positions shown in the figure. However, if descriptions of the positions of the components change, these direction indications change accordingly.

In embodiments of this application, the term "direct bonding" means that surfaces of two objects are directly bonded and then bonded by using a bonding process, and the two objects are bonded without using an intermediate material as a solder.

In embodiments of this application, the term "back surface of a monocrystalline silicon carbide ingot" is a (000$\bar{1}$) crystal face of the monocrystalline silicon carbide ingot, and the term "front surface of the monocrystalline silicon carbide ingot" is a (0001) crystal face of the monocrystalline silicon carbide ingot.

In embodiments of this application, the term "back surface of a second silicon carbide layer" is a (000$\bar{1}$) crystal face of the second silicon carbide layer, and the term "front surface of the second silicon carbide layer" is a (0001) crystal face of the second silicon carbide layer.

In embodiments of this application, the term "defect density" is calculated by dividing a defect quantity by a volume. A defect quantity of a film layer may be calculated, for example, by analyzing the film layer under an optical microscope at a magnification of 50 times to 400 times, and dividing a quantity of detected defects by a volume of the film layer.

An embodiment of this application provides an electronic device. The electronic device may be, for example, a charging pile, an uninterruptible power system (uninterruptible power system, UPS), a photovoltaic inverter, or a motor drive power supply. A specific form of the electronic device is not specifically limited in embodiments of this application.

A metal-oxide-semiconductor field-effect transistor (metal-oxide-semiconductor field-effect transistor, MOSFET) device is a semiconductor device, and has advantages such as low power consumption, stable performance, a strong radiation resistance capability, a convenient control mode, a small size, a light weight, a long service life, a strong anti-interference capability, a high working frequency, and a simple bias. Therefore, the metal-oxide-semiconductor field-effect transistor is widely used in an analog circuit and a digital circuit.

For example, the electronic device is a UPS, and the UPS is a unit configured to supply power to a load that requires a continuous supply of electric energy, for example, a computer. FIG. 1 is a schematic diagram of a UPS and a peripheral structure of the UPS. The UPS includes an input end and an output end. The input end of the UPS is connected to a power system, and the output end of the UPS is connected to a load, to implement uninterruptible power supply to the load.

The power system may be, for example, a power plant, a transformer station, or a mains transmission line. When the power system is in a normal state, a part of power supplied by the power system is transmitted to the load through the UPS, and a part of the power supplied by the power system is stored in the UPS. When the power system is in an abnormal state, the power system cannot transmit power to the load. In this case, the power stored in the UPS is transmitted to the load.

The load consumes the power supplied by the power system. For example, the load may be an electrical device in a factory, or may be a communication device, for example, a server, a processor, or a memory in a data center.

The UPS is an automatic system configured to supply power without interruption immediately when supplying electric energy by the power system is interrupted or failed. If a voltage or a frequency of the power supplied by the power system changes, or power supply from the power system is interrupted or changed instantaneously, the UPS supplies power stably. This reduces a possibility of damage, a loss, or deletion of load data and a possibility of a shutdown or failure of a control device.

The UPS includes assemblies such as a power device and a bidirectional switch, and is configured to implement the foregoing functions of the UPS. An MOSFET device may be used as the power device in the foregoing UPS. It should be understood that, when the MOSFET device is used as the power device, the electronic device provided in this embodiment of this application is not limited to the UPS shown in FIG. 1, and any electronic device that needs to use a power device belongs to an application scenario of embodiments of this application.

Figure 2:
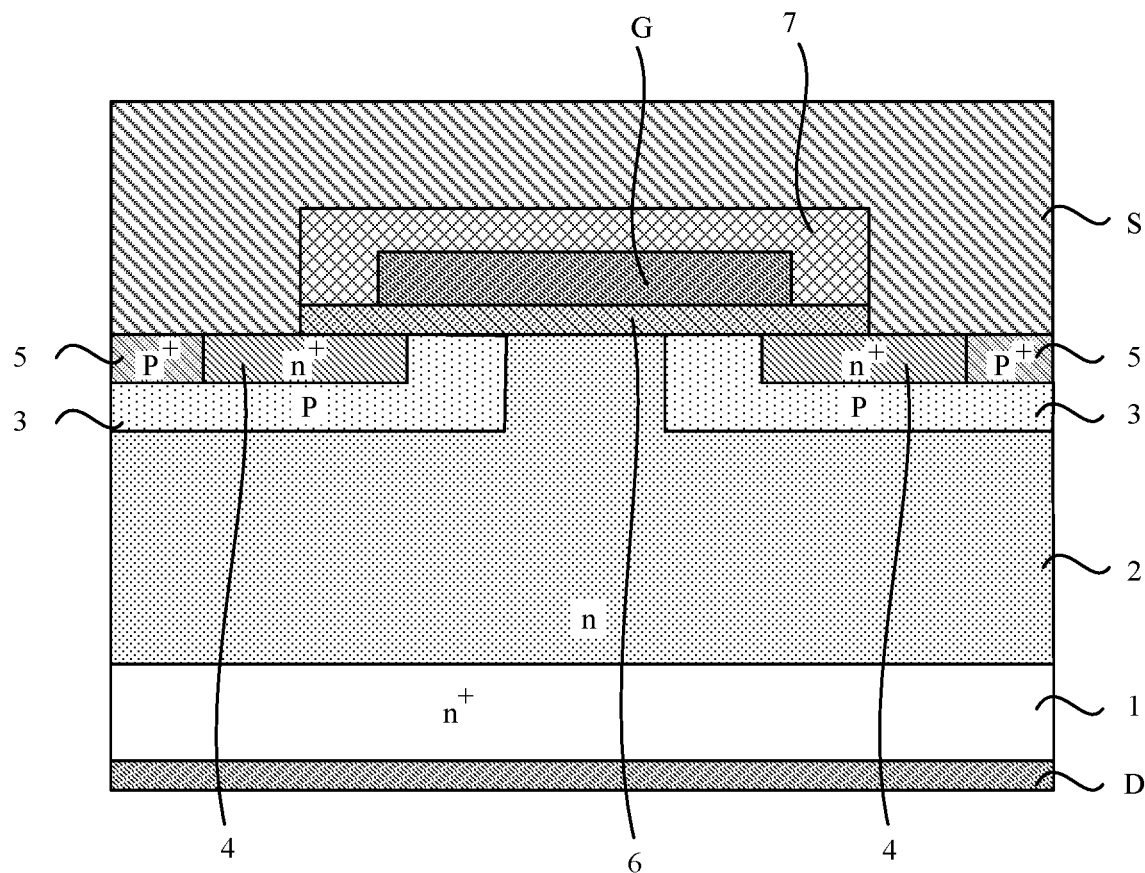
FIG. 2 is a schematic diagram of a structure of a metal-oxide-semiconductor field-effect transistor according to an embodiment of this application.

For example, a structure of an MOSFET device is shown in FIG. 2. The MOSFET device includes a substrate 1, a semiconductor layer 2, well regions 3, source regions 4, contact regions 5, an insulating film 6, a gate (gate, G), a source (source, S), an interlayer insulating film 7, and a drain (drain, D)

The semiconductor layer 2, the well regions 3, the source regions 4, the contact regions 5, the insulating film 6, the gate G, the source S, the interlayer insulating film 7, and the drain D may be referred to as a switch functional assembly of the MOSFET device. As the name implies, the switch functional assembly of the MOSFET device is a combination of structures configured to implement a switch function of the MOSFET device, and the substrate 1 is configured to bear the switch functional assembly of the MOSFET device.

A working principle of the MOSFET device is as follows: A region that is in the well region 3 and that is located between the source region 4 and the semiconductor layer 2 is used as a conductive channel of the MOSFET device. When a voltage of the gate G is greater than a threshold voltage of the MOSFET device, the conductive channel is turned on; and electrons from the source S flow through the channel under effect of a voltage of the drain D, flow downward to the substrate 1, and reach the drain D, to form a source-drain current. When the voltage of the gate G is less than the threshold voltage of the MOSFET device, the conductive channel is turned off, and the source-drain current is turned off.

Silicon carbide (SiC) materials feature a wide band gap, high critical breakdown field strength, and high thermal conductivity. Therefore, SiC power devices using SiC materials as substrates are resistant to high voltages and high temperatures, and have a fast switching speed and low switching loss, and are widely used in the fields of aeronautics and astronautics, smart grid, rail transportation, new energy power generation, electric vehicles, industrial power supply, and the like.

Figure 3:
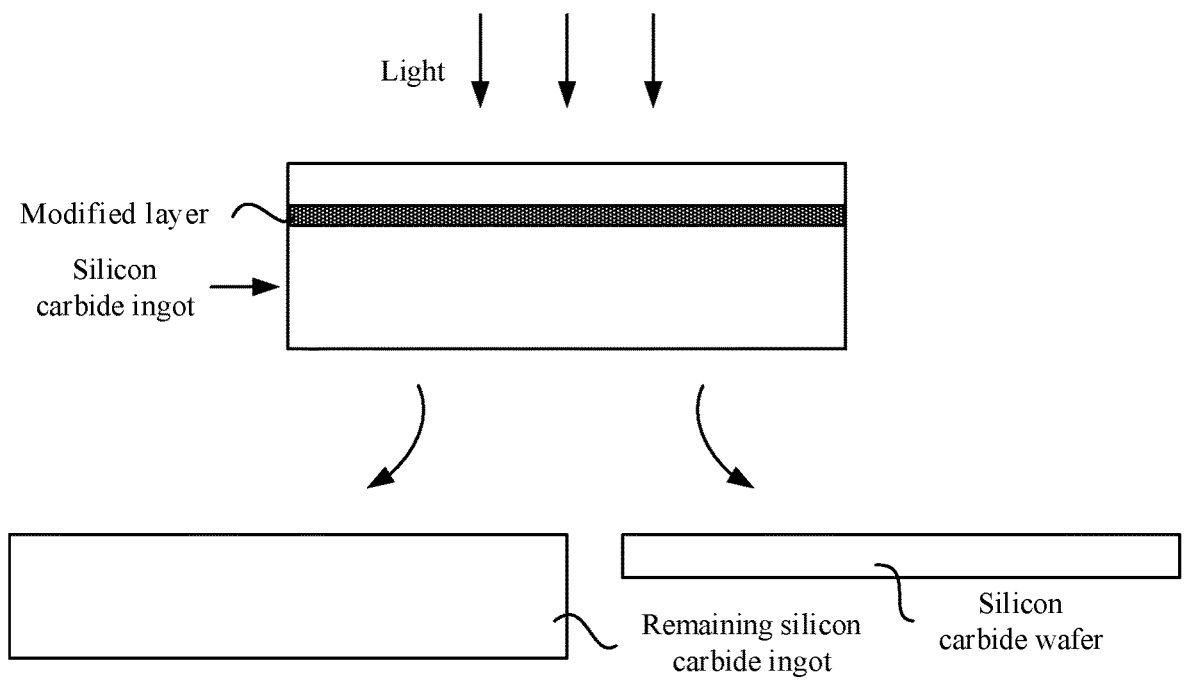
FIG. 3 is a schematic diagram of a composite substrate preparation process according to an embodiment of this application.

To resolve problems of high costs of silicon carbide (SiC) power devices due to high costs of SiC substrates and severely limited promotion and application of the SiC power devices in various fields, a method for peeling off a SiC homoepitaxial layer is provided. As shown in FIG. 3, laser light that has transmittance to a monocrystalline SiC is irradiated on a SiC ingot, and is focused on an inner layer, to form a modified layer. A SiC wafer is formed from a monocrystalline SiC ingot by cutting off the monocrystalline SiC ingot along the modified layer under stress.

The method for peeling off a SiC homoepitaxial layer can effectively reduce a cutting loss of the SiC ingot, improve cutting efficiency of the SiC ingot, and reduce costs of the SiC substrate.

However, the method for peeling off a SiC homoepitaxial layer mainly focuses on reducing a cutting loss of the SiC ingot and improving cutting efficiency of the SiC ingot, and cannot effectively utilize unqualified SiC ingots and SiC wafers.

Figure 4:
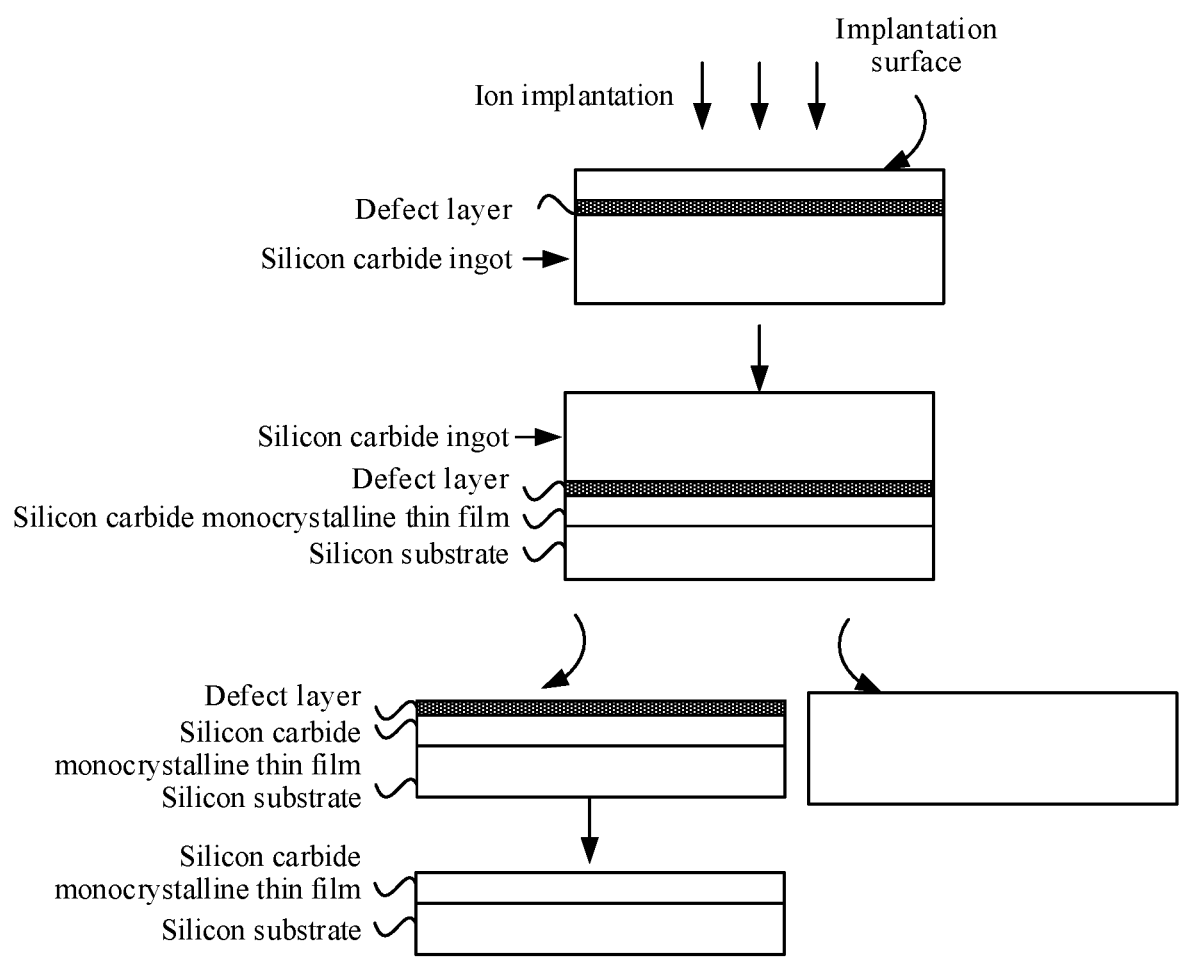
FIG. 4 is a schematic diagram of another composite substrate preparation process according to an embodiment of this application.

A method for preparing a silicon-based heterogeneous integrated SiC thin film structure is further provided. As shown in FIG. 4, a defect layer is formed by performing ion implantation on monocrystalline SiC. An implantation surface is bonded to a silicon substrate to form a composite structure, and then the SiC is peeled off by annealing to form a composite structure including the defect layer, a SiC monocrystalline thin film, and the silicon substrate. Then, the defect layer in the composite structure is removed, and a composite substrate including the SiC monocrystalline thin film and the silicon substrate is formed.

In the method for preparing a silicon-based heterogeneous integrated SiC thin film structure, the technology mainly focuses on reducing SiC substrate preparing costs through SiC heterogeneous bonding. However, the SiC monocrystalline thin film is heterogeneously bonded on the silicon (Si) substrate, and SiC and Si form a heterojunction. When a current is longitudinally transmitted in a power device, the current needs to cross the heterojunction, and Si has poor thermal conductivity. As a result, the composite substrate has poor performance in terms of electrical conductivity and thermal conductivity. In addition, limited by a temperature of a SiC epitaxy process, SiC epitaxial growth cannot be performed.

To resolve the foregoing problems, an embodiment of this application further provides a composite substrate preparation method. A composite substrate prepared by using the composite substrate preparation method can resolve the foregoing problems of ineffective utilization of unqualified SiC ingots and SiC wafers and poor performance of the composite substrate in electrical conductivity and thermal conductivity, thereby reducing SiC substrate preparation costs, reducing SiC power device costs, and promoting application of SiC power devices in various fields.

The following describes the composite substrate preparation method provided in this embodiment of this application by using several examples.

Example 1

Figure 5A:
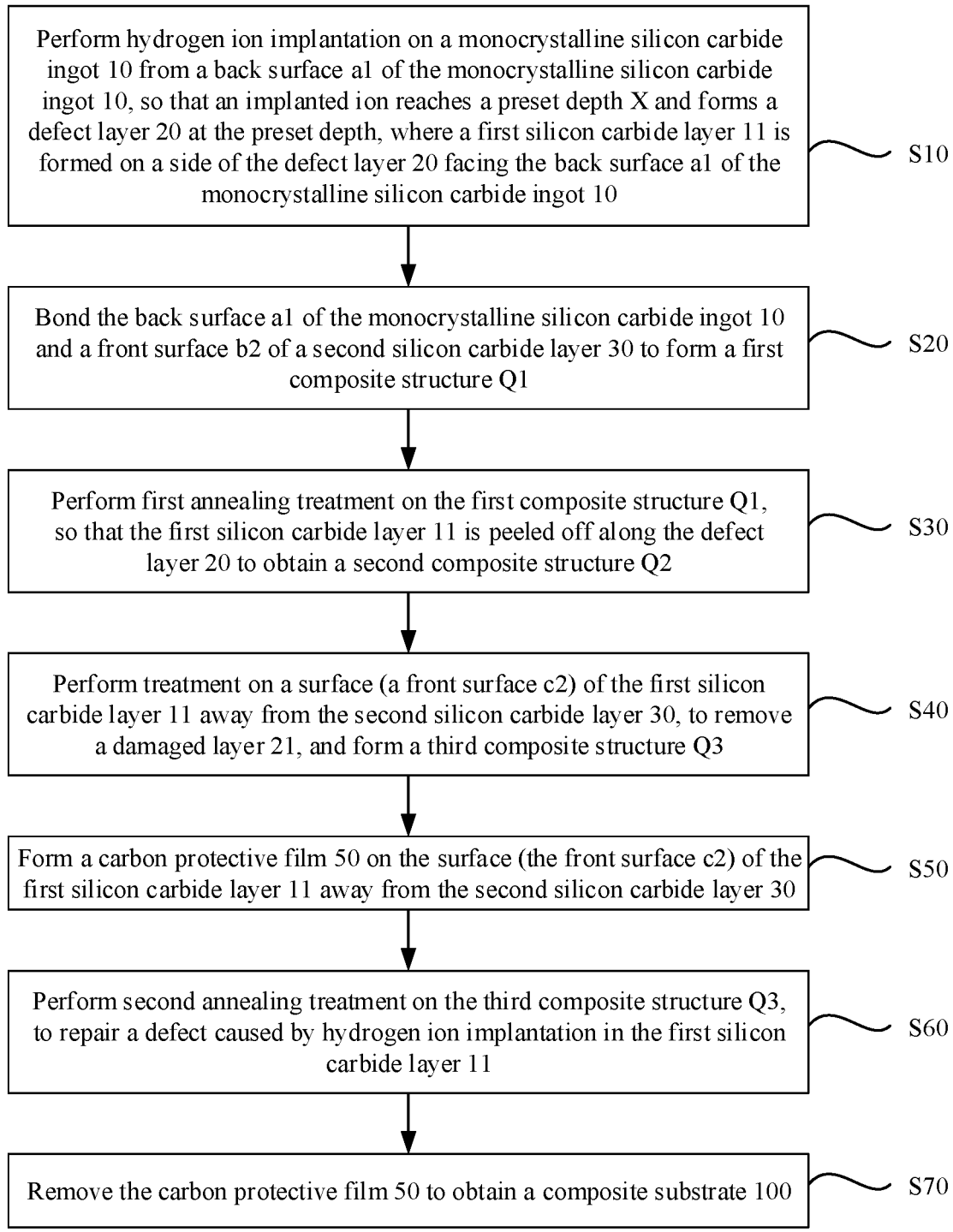
FIG. 5A is a schematic flowchart of preparing a composite substrate according to an embodiment of this application.

As shown in FIG. 5A, this embodiment of this application provides a composite substrate preparation method, including the following steps.

Figure 5B:
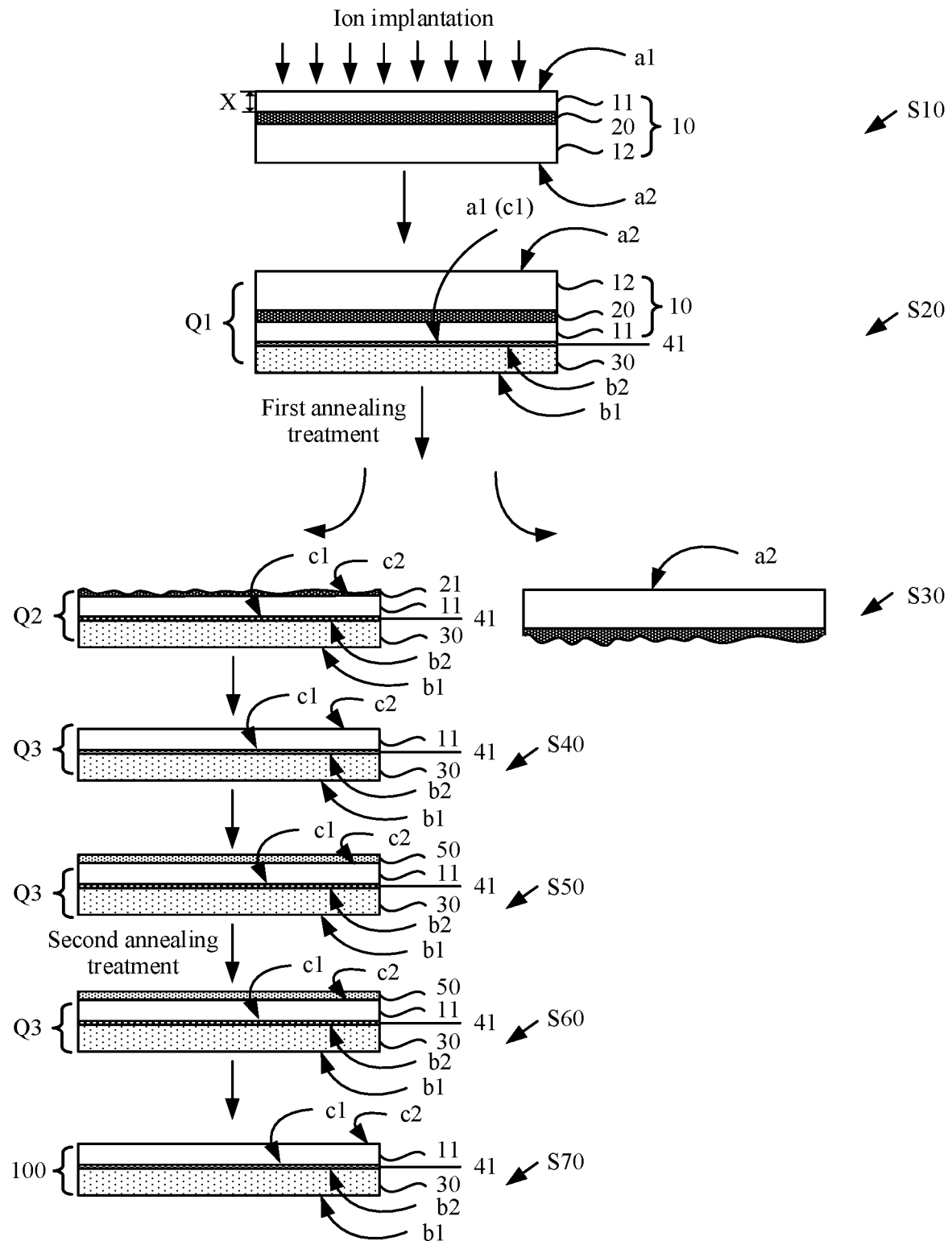
FIG. 5B is a schematic diagram of a composite substrate preparation process according to an embodiment of this application.

S10: As shown in FIG. 5B, perform hydrogen ion implantation on a monocrystalline silicon carbide ingot 10 from a back surface a1 of the monocrystalline silicon carbide ingot 10, so that an implanted ion reaches a preset depth X and forms a defect layer 20 at the preset depth, where a first silicon carbide layer 11 is formed on a side of the defect layer 20 facing the back surface a1 of the monocrystalline silicon carbide ingot 10.

To be specific, a part that is in the monocrystalline silicon carbide ingot 10 and that is located on the side of the defect layer 20 facing the back surface a1 of the monocrystalline silicon carbide ingot 10 is used as the first silicon carbide layer 11.

In some embodiments, a lattice direction of the monocrystalline silicon carbide ingot 10 is deflected in a range greater than or equal to 0° and less than or equal to 8° from a <0001> lattice direction.

For example, the lattice direction of the monocrystalline silicon carbide ingot 10 is the <0001> lattice direction and is not deflected (or deflected by 0°), the lattice direction of the monocrystalline silicon carbide ingot 10 is deflected by 1° from the <0001> lattice direction, the lattice direction of the monocrystalline silicon carbide ingot 10 is deflected by 2° from the <0001> lattice direction, the lattice direction of the monocrystalline silicon carbide ingot 10 is deflected by 3° from the <0001> lattice direction, the lattice direction of the monocrystalline silicon carbide ingot 10 is deflected by 4° from the <0001> lattice direction, the lattice direction of the monocrystalline silicon carbide ingot 10 is deflected by 5° from the <0001> lattice direction, the lattice direction of the monocrystalline silicon carbide ingot 10 is deflected by 6° from the <0001> lattice direction, or the lattice direction of the monocrystalline silicon carbide ingot 10 is deflected by 7° from the <0001> lattice direction.

In this way, a lattice direction of the first silicon carbide layer 11 obtained by using the monocrystalline silicon carbide ingot 10 is also deflected in the range greater than or equal to 0° and less than or equal to 8° from the <0001> lattice direction, and a small lattice mismatch exists between the first silicon carbide layer 11 and an epitaxially grown semiconductor layer, so that defect density of subsequent epitaxial growth on a surface of the first silicon carbide layer 11 can be reduced.

To ensure that a complete flat defect layer 20 is formed, in some embodiments, energy of hydrogen ion implantation is greater than or equal to 100 keV. In some embodiments, a dose of hydrogen ion implantation is greater than or equal to 1e16 cm$^{-2}$. In some embodiments, an angle of hydrogen ion implantation is in a range greater than or equal to 5° and less than or equal to 45°. For example, the angle of hydrogen ion implantation may be 10°, 20°, 30°, or 40°. A structure of the defect layer 20 may be adjusted by adjusting the energy, dose, and angle of hydrogen ion implantation.

In other words, the defect layer 20 is formed at the preset depth X of the monocrystalline silicon carbide ingot 10 by performing hydrogen ion implantation. The defect layer 20 divides the monocrystalline silicon carbide ingot 10 into two parts. The part that is located at the defect layer 20 and that is close to the back surface a1 of the monocrystalline silicon carbide ingot 10 is the first silicon carbide layer 11, and the part (close to a front surface a2 of the monocrystalline silicon carbide ingot 10) that is located at the defect layer 20 and that is away from the back surface a1 of the monocrystalline silicon carbide ingot 10 is a remaining monocrystalline silicon carbide ingot 12.

After being polished, the remaining monocrystalline silicon carbide ingot 12 can be used as a monocrystalline silicon carbide ingot 10 for preparing a composite substrate next time. Certainly, if a thickness of the remaining monocrystalline silicon carbide ingot 12 can be used as the first silicon carbide layer 11, the remaining monocrystalline silicon carbide ingot 12 can be directly used as the first silicon carbide layer 11.

A thickness of the first silicon carbide layer 11 can be adjusted by adjusting the preset depth X. However, in the hydrogen ion implantation process, an implanted ion may be adjusted to reach the preset depth X by adjusting the energy of hydrogen ion implantation.

In some embodiments, the energy of hydrogen ion implantation is adjusted, so that the thickness of the first silicon carbide layer 11 is less than or equal to 350 μm.

For example, the thickness of the first silicon carbide layer 11 may be 300 μm, 250 μm, 200 μm, 150 μm, or 100 μm.

It should be understood that the back surface a1 of the monocrystalline silicon carbide ingot 10 and the front surface a2 of the monocrystalline silicon carbide ingot 10 are disposed opposite to each other. In some embodiments, roughness of the back surface a1 of the monocrystalline silicon carbide ingot 10 is equal to roughness of the front surface a2 of the monocrystalline silicon carbide ingot 10.

For example, the roughness of the back surface a1 of the monocrystalline silicon carbide ingot 10 is less than or equal to 0.5 nm. In other words, roughness of a back surface of the first silicon carbide layer 11 is less than or equal to 0.5 nm.

S20: As shown in FIG. 5B, bond the back surface a1 of the monocrystalline silicon carbide ingot 10 and a front surface b2 of a second silicon carbide layer 30 to form a first composite structure Q1.

Similarly, a back surface b1 of the second silicon carbide layer 30 is disposed opposite to the front surface b2 of the second silicon carbide layer 30. In some embodiments, roughness of the back surface b1 of the second silicon carbide layer 30 is equal to roughness of the front surface b2 of the second silicon carbide layer 30.

For example, the roughness of the front surface b2 of the second silicon carbide layer 30 is less than or equal to 0.5 nm.

In some embodiments, a thickness of the second silicon carbide layer 30 is less than or equal to 3000 μm.

For example, the thickness of the second silicon carbide layer 30 may be 2500 μm, 2000 μm, 1500 μm, 1000 μm, or 500 μm.

The second silicon carbide layer 30 only needs to support and bear the monocrystalline silicon carbide ingot 10, and an excessively thick second silicon carbide layer 30 may result in a waste of resources and increase a thickness of a composite substrate.

Defect density of the second silicon carbide layer 30 is greater than defect density of the monocrystalline silicon carbide ingot 10. In other words, the defect density of the second silicon carbide layer 30 is greater than defect density of the first silicon carbide layer 11.

In some embodiments, defect density of a part of the second silicon carbide layer 30 is greater than the defect density of the monocrystalline silicon carbide ingot 10.

In other words, the defect density of a part of the second silicon carbide layer 30 is greater than the defect density of the first silicon carbide layer 11.

In some embodiments, defect density of the complete second silicon carbide layer 30 is greater than the defect density of the monocrystalline silicon carbide ingot 10.

In other words, the defect density of the complete second silicon carbide layer 30 is greater than the defect density of the first silicon carbide layer 11.

In view of this, compared with the second silicon carbide layer 30, the monocrystalline silicon carbide ingot 10 is a high-quality (P-level) silicon carbide structure, and compared with the monocrystalline silicon carbide ingot 10, the second silicon carbide layer 30 is a low-quality (D-level) silicon carbide structure.

In some embodiments, a lattice direction of the second silicon carbide layer 30 is also deflected in a range greater than or equal to 0° and less than or equal to 8° from a <0001> lattice direction.

For example, a deflection angle of the lattice direction of the second silicon carbide layer 30 is the same as a deflection angle of the lattice direction of the monocrystalline silicon carbide ingot 10.

In some embodiments, a material of the second silicon carbide layer 30 includes monocrystalline silicon carbide or polycrystalline silicon carbide.

For a manner in which the back surface a1 of the monocrystalline silicon carbide ingot 10 is bonded to the front surface b2 of the second silicon carbide layer 30, in some embodiments, the back surface a1 of the monocrystalline silicon carbide ingot 10 is directly bonded to the front surface b2 of the second silicon carbide layer 30.

To be specific, the back surface a1 of the monocrystalline silicon carbide ingot 10 is disposed opposite to the front surface b2 of the second silicon carbide layer 30, and the monocrystalline silicon carbide ingot 10 is directly bonded to the second silicon carbide layer 30.

It may be understood that the first silicon carbide layer 11 is obtained from the monocrystalline silicon carbide ingot 10, and the back surface a1 of the monocrystalline silicon carbide ingot 10 is the back surface c1 of the first silicon carbide layer 11. Therefore, the back surface a1 of the monocrystalline silicon carbide ingot 10 is directly bonded to the front surface b2 of the second silicon carbide layer 30, that is, the first silicon carbide layer 11 is directly bonded to the second silicon carbide layer 30.

For example, surface cleaning and surface treatment are performed on the back surface a1 of the monocrystalline silicon carbide ingot 10 and the front surface b2 of the second silicon carbide layer 30, and then the back surface a1 of the monocrystalline silicon carbide ingot 10 is directly bonded to the front surface b2 of the second silicon carbide layer 30.

A manner of performing surface treatment on the back surface a1 of the monocrystalline silicon carbide ingot 10 and the front surface b2 of the second silicon carbide layer 30 may include, for example, at least one of wet cleaning, activation, chemical activation, plasma activation, and metal deposition.

In addition, direct bonding between the back surface a1 of the monocrystalline silicon carbide ingot 10 and the front surface b2 of the second silicon carbide layer 30 may be performed in an environment such as a normal temperature environment, a high temperature environment, a high voltage environment, a normal voltage environment, or a vacuum environment. This is not limited in this embodiment of this application.

It may be understood that, in a process in which the back surface a1 of the monocrystalline silicon carbide ingot 10 is directly bonded to the front surface b2 of the second silicon carbide layer 30, a first bonding layer 41 is naturally formed. A thickness of the first bonding layer 41 can be controlled by controlling duration of bonding the back surface a1 of the monocrystalline silicon carbide ingot 10 to the front surface b2 of the second silicon carbide layer 30.

In some embodiments, the thickness of the first bonding layer 41 formed by directly bonding the first silicon carbide layer 11 to the second silicon carbide layer 30 is less than or equal to 5 nm. For example, the thickness of the first bonding layer 41 may be 1 nm, 2 nm, 3 nm, or 4 nm.

An excessively thick first bonding layer 41 may affect the electrical conductivity and thermal conductivity of the composite substrate. Therefore, the thickness of the first bonding layer 41 is controlled to be less than or equal to 5 nm, and the thickness of the first bonding layer 41 is reduced as much as possible while ensuring that the back surface a1 of the monocrystalline silicon carbide ingot 10 is directly bonded to the front surface b2 of the second silicon carbide layer 30.

In view of this, it may be understood that the first composite structure Q1 includes the monocrystalline silicon carbide ingot 10, the first bonding layer 41, and the second silicon carbide layer 30.

In some embodiments, before step S20 is performed, the composite substrate preparation method further includes: performing surface treatment on the back surface a1 of the monocrystalline silicon carbide ingot 10, so that the roughness of the back surface a1 (a surface bonded to the second silicon carbide layer 30) of the monocrystalline silicon carbide ingot 10 is less than or equal to 0.5 nm.

In some embodiments, one or more of wet cleaning, plasma activation, high temperature annealing, CMP, CP, mechanical polishing, reactive ion etching, ion beam etching, or ion beam grazing-incidence polishing processes is performed on the back surface a1 of the monocrystalline silicon carbide ingot 10.

This can avoid excessively small bonding force caused by excessive roughness of the back surface a1 of the monocrystalline silicon carbide ingot 10, and prevent affecting a bonding effect between the monocrystalline silicon carbide ingot 10 and the second silicon carbide layer 30.

In some embodiments, before step S20 is performed, the composite substrate preparation method further includes: performing surface treatment on the front surface b2 of the second silicon carbide layer 30, so that the roughness of the front surface b2 (a surface bonded to the monocrystalline silicon carbide ingot 10) of the second silicon carbide layer 30 is less than or equal to 0.5 nm.

In some embodiments, one or more of wet cleaning, plasma activation, high temperature annealing, chemical mechanical polishing (chemical mechanical polishing, CMP), chemical polishing (chemical polishing, CP), mechanical polishing, reactive ion etching, ion beam etching, or ion beam grazing-incidence polishing processes is performed on the front surface b2 of the second silicon carbide layer 30.

This can avoid excessively small bonding force caused by excessive roughness of the front surface b2 of the second silicon carbide layer 30, and prevent affecting a bonding effect between the monocrystalline silicon carbide ingot 10 and the second silicon carbide layer 30.

S30: As shown in FIG. 5B, perform first annealing treatment on the first composite structure Q1, so that the first silicon carbide layer 11 is peeled off along the defect layer 20 to form a second composite structure Q2.

The second composite structure Q2 includes a damaged layer 21 separated from the defect layer 20, and the first silicon carbide layer 11 and the second silicon carbide layer 30 that are bonded. The damaged layer 21 is located on a surface (a front surface c2 of the first silicon carbide layer 11) of the first silicon carbide layer 11 away from the second silicon carbide layer 30.

The first annealing treatment, for example, a thermal annealing process, may be performed on the first composite structure Q1.

In some embodiments, an annealing temperature at which the first annealing treatment is performed on the first composite structure Q1 may be, for example, greater than or equal to 1000° C. For example, the annealing temperature of the first annealing treatment may be 1050° C., 1100° C., or 1150° C.

In some embodiments, an annealing environment in which the first annealing treatment is performed on the first composite structure Q1 is at least one of $N_2$ (nitrogen), Ar (argon), or $H_2$ (hydrogen).

Annealing duration of the first annealing treatment is not limited in this embodiment of this application, and is properly determined based on factors such as a thickness of the defect layer 20, so that the defect layer 20 can be naturally cracked to obtain the second composite structure Q2.

S40: As shown in FIG. 5B, perform treatment on the surface (the front surface c2) of the first silicon carbide layer 11 away from the second silicon carbide layer 30, to remove the damaged layer 21, and form a third composite structure Q3.

In some embodiments, one or more of wet cleaning, plasma activation, high temperature annealing, CMP, CP, mechanical polishing, reactive ion etching, ion beam etching, or ion beam grazing-incidence polishing processes is performed on the surface (the front surface c2) of the first silicon carbide layer 11 away from the second silicon carbide layer 30, to remove the damaged layer 21.

It may be understood that the damaged layer 21 may be removed by performing treatment on the surface (the front surface c2) of the first silicon carbide layer 11 away from the second silicon carbide layer 30, to obtain the third composite structure Q3 that includes the first silicon carbide layer 11 and the second silicon carbide layer 30 (for example, the first silicon carbide layer 11, the first bonding layer 41, and the second silicon carbide layer 30) that are bonded.

In some embodiments, treatment on the surface (the front surface c2) of the first silicon carbide layer 11 away from the second silicon carbide layer 30 includes at least one or more of CMP, CP, or mechanical polishing processes, to reduce roughness of the surface (the front surface c2) of the first silicon carbide layer 11 away from the second silicon carbide layer 30.

In some embodiments, after surface treatment is performed on the surface of the first silicon carbide layer 11 away from the second silicon carbide layer 30, the roughness of the surface of the first silicon carbide layer 11 away from the second silicon carbide layer 30 is less than or equal to 0.5 nm.

To be specific, the roughness of the front surface c2 of the first silicon carbide layer 11 is less than or equal to 0.5 nm to meet a requirement on the roughness of the front surface c2 of the first silicon carbide layer 11 when an epitaxial layer is formed on the composite substrate.

S50: As shown in FIG. 5B, form a carbon protective film 50 on the surface (the front surface c2) of the first silicon carbide layer 11 away from the second silicon carbide layer 30.

The carbon protective film 50 may be formed on the surface (the front surface c2) of the first silicon carbide layer 11 away from the second silicon carbide layer 30 by using a sputtering process.

An excessively thick carbon protective film 50 may result in a waste of resources, and an excessively thin carbon protective film 50 may not form a protection. In some embodiments, a thickness of the carbon protective film 50 is 10 nm to 50 nm. For example, the thickness of the carbon protective film 50 may be 20 nm, 25 nm, 30 nm, 35 nm, or 40 nm.

Forming the carbon protective film 50 on the surface (the front surface c2) of the first silicon carbide layer 11 away from the second silicon carbide layer 30 can avoid carbon evaporation and silicon precipitation in the first silicon carbide layer 11 due to an excessively high temperature in a subsequent high temperature annealing process, and prevent the surface (the front surface c2) of the first silicon carbide layer 11 away from the second silicon carbide layer 30 from being roughened.

S60: As shown in FIG. 5B, perform second annealing treatment on the third composite structure Q3, to repair a defect caused by hydrogen ion implantation in the first silicon carbide layer 11.

It may be understood that, when the carbon protective film 50 is formed on the surface (the front surface c2) of the first silicon carbide layer 11 away from the second silicon carbide layer 30, that is, when the composite substrate preparation method includes step S50, the second annealing treatment is performed on the third composite structure Q3, that is, treatment is performed on a structure covered with the carbon protective film 50 on a surface of the third composite structure Q3.

The second annealing treatment, for example, a thermal annealing process, may be performed on the third composite structure Q3. An annealing temperature of the second annealing treatment is greater than the annealing temperature of the first annealing treatment.

In some embodiments, the annealing temperature at which the second annealing treatment is performed on the third composite structure Q3 may be, for example, greater than or equal to 1200° C. For example, the annealing temperature of the second annealing treatment may be 1250° C., 1300° C., 1350° C., or 1400° C.

In some embodiments, an annealing environment in which the second annealing treatment is performed on the third composite structure Q3 is at least one of a normal pressure, a vacuum, $N_2$, Ar, or a C-containing (carbon-containing) gas.

Annealing duration of the second annealing treatment is not limited in this embodiment of this application, provided that a defect caused by hydrogen ion implantation in the first silicon carbide layer 11 can be rectified. In addition, the fixed defect herein may be completely fixed, or may be fixed to some extent, and treatment may be performed based on an actual requirement.

S70: As shown in FIG. 5B, remove the carbon protective film 50 to obtain the composite substrate 100.

For example, the carbon protective film 50 may be removed by using a high temperature oxidation or plasma treatment process.

It should be noted that, in some embodiments, the composite substrate preparation method does not include step S50. To be specific, before the second annealing treatment is performed on the third composite structure Q3, the carbon protective film 50 is not formed, and the second annealing treatment is directly performed on the third composite structure Q3.

In this way, the composite substrate preparation method does not include step S70 either. Therefore, it may be understood that the composite substrate 100 may be directly obtained after the second annealing treatment is performed on the third composite structure Q3 in step S60.

The following describes the composite substrate preparation method provided in this example by using a specific embodiment as an example.

A composite substrate preparation method includes the following processes.

Hydrogen ion ($H^+$) implantation is performed from a back surface a1 of an N-type monocrystalline silicon carbide ingot 10 with a lattice direction deflected by 4° from a <0001> lattice direction to a <11$\bar{2}$0> lattice direction, to form a defect layer 20 at a position of a preset depth X under the back surface a1.

A temperature of hydrogen ion implantation is room temperature, energy of hydrogen ion implantation is 100 keV, a dose of hydrogen ion implantation is 1e17 $cm^{-2}$, and an angle of hydrogen ion implantation is 7°.

Cleaning with a chemical agent and drying are performed on the back surface of the monocrystalline silicon carbide ingot 10 and a front surface b2 of a second silicon carbide layer 30 with the same specifications. Then, Ar, $N_2$, or $O_2$ (oxygen) plasma activation is performed on the back surface a1 of the monocrystalline silicon carbide ingot 10 and the front surface b2 of the second silicon carbide layer 30. In a normal temperature and $10^{-4}$ mbar vacuum environment, the back surface a1 of the monocrystalline silicon carbide ingot 10 is directly bonded to the front surface b2 of the second silicon carbide layer 30, to form a first composite structure Q1.

Bonding pressure is 5 kN, and bonding duration is 30 min.

The first composite structure Q1 is placed into a high temperature annealing furnace. In an $N_2$ environment, a temperature is increased to 1000° C. at a rate of 20° C./s. The first composite structure Q1 is annealed for 60 min, and then removed from the furnace after cooling. The monocrystalline silicon carbide ingot 10 is automatically peeled off along the defect layer 20 to form a second composite structure Q2.

The second composite structure Q2 includes a damaged layer 21 separated from the defect layer 20, and the first silicon carbide layer 11 and the second silicon carbide layer 30 that are bonded. The damaged layer 21 is located on a surface of the first silicon carbide layer 11 away from the second silicon carbide layer 30. After the peeled surface is polished, a remaining monocrystalline silicon carbide ingot 12 can be used as a monocrystalline silicon carbide ingot 10 for preparing a composite substrate next time.

Surface treatment is performed on the surface of the first silicon carbide layer 11 away from the second silicon carbide layer 30 in the second composite structure Q2, to remove the damaged layer 21, and make roughness of the surface of the first silicon carbide layer 11 be less than or equal to 0.5 nm, to obtain a third composite structure Q3.

For example, dry polishing is first performed on the surface by using an 8000 # grinding wheel, until the roughness of the surface is 10 nm. Then, CMP is performed on the surface for grinding, so that the roughness of the surface of the first silicon carbide layer 11 is less than or equal to 0.5 nm.

Sputtering is performed on the surface of the first silicon carbide layer 11 away from the second silicon carbide layer 30 to form a 20 nm carbon protective film 50. In a vacuum environment and an annealing environment at 1650° C., the third composite structure Q3 is annealed for 30 min and then removed from the furnace. Then, the carbon protective film 50 is completely etched by using oxygen-containing plasma to form a composite substrate that meets a requirement for epitaxial growth.

Figure 6:
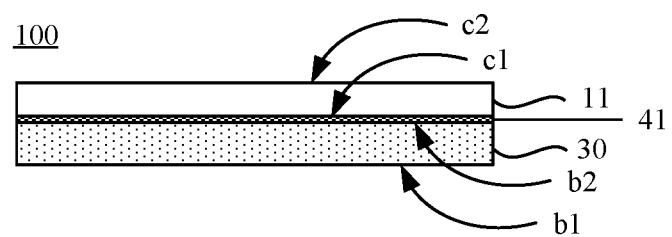
FIG. 6 is a diagram of a structure of a composite substrate according to an embodiment of this application.

In view of this, as shown in FIG. 6, an embodiment of this application provides a composite substrate 100, including a first silicon carbide layer 11 and a second silicon carbide layer 30.

The first silicon carbide layer 11 is prepared by using the foregoing monocrystalline silicon carbide ingot 10. A material of the first silicon carbide layer 11 includes monocrystalline silicon carbide, or it is understood that the first silicon carbide layer 11 is a silicon carbide monocrystalline wafer.

The second silicon carbide layer 30 is disposed on a side of a back surface c1 of the first silicon carbide layer 11, a front surface b2 of the second silicon carbide layer 30 faces the back surface c1 of the first silicon carbide layer 11, and the second silicon carbide layer 30 is bonded to the first silicon carbide layer 11.

Defect density of at least a part of the second silicon carbide layer 30 is greater than defect density of the first silicon carbide layer 11, that is, compared with the first silicon carbide layer 11, the second silicon carbide layer 30 is a low-quality silicon carbide structure.

In some embodiments, a material of the second silicon carbide layer 30 includes monocrystalline silicon carbide or polycrystalline silicon carbide.

It may be understood that, if the material of the second silicon carbide layer 30 includes monocrystalline silicon carbide, the defect density of the second silicon carbide layer 30 is still greater than the defect density of the first silicon carbide layer 11.

In some embodiments, as shown in FIG. 6, the first silicon carbide layer 11 is directly bonded to the second silicon carbide layer 30. The first silicon carbide layer 11 is directly bonded to the second silicon carbide layer 30 to form a first bonding layer 41.

Example 2

Compared with Example 1, a difference of Example 2 lies in that a first silicon carbide layer 11 and a second silicon carbide layer 30 are bonded by using a transition layer 42.

Figure 7A:
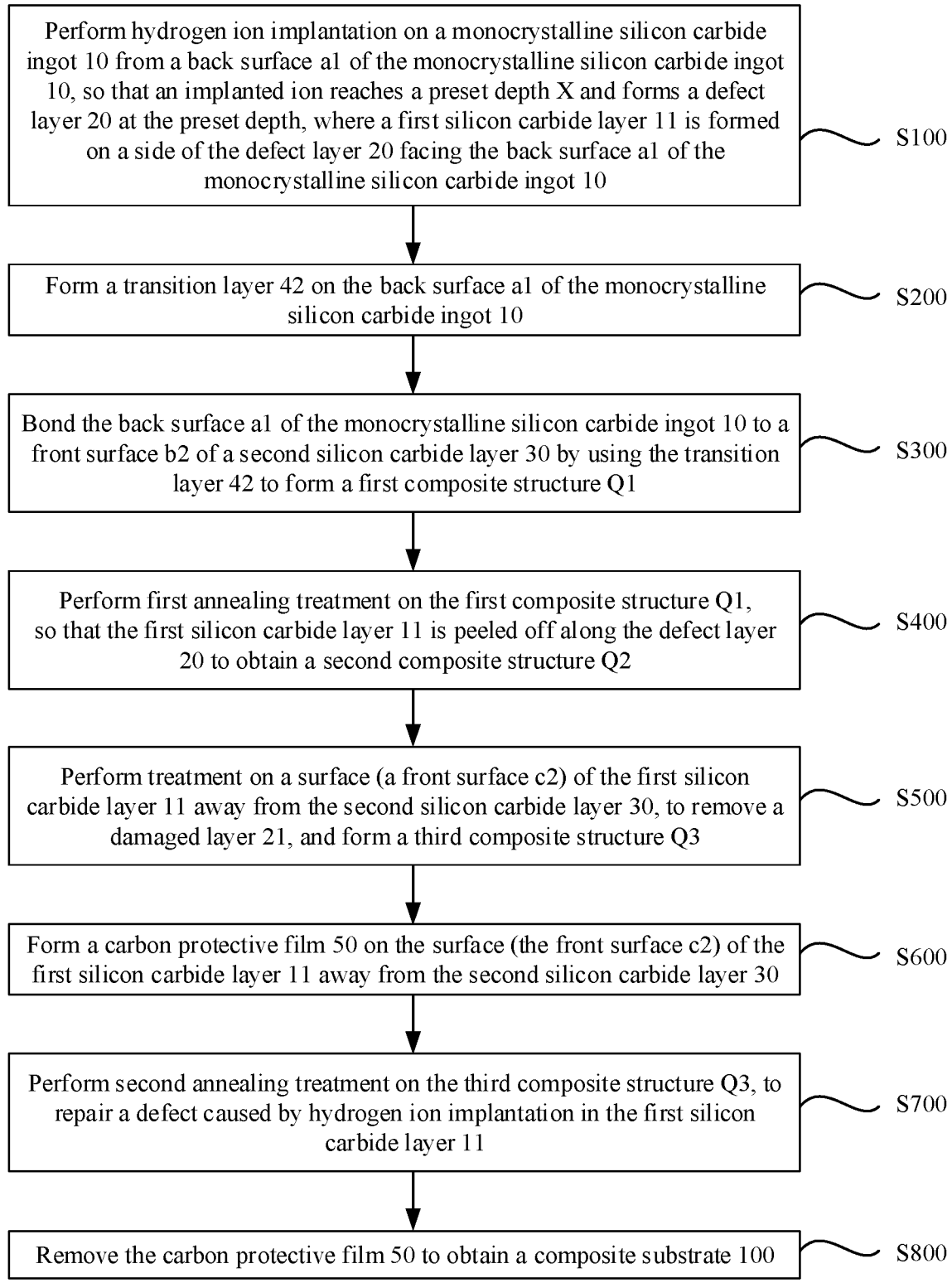
FIG. 7A is a schematic flowchart of preparing another composite substrate according to an embodiment of this application.

This embodiment of this application further provides a composite substrate preparation method, as shown in FIG. 7A, including the following steps.

Figure 7B:
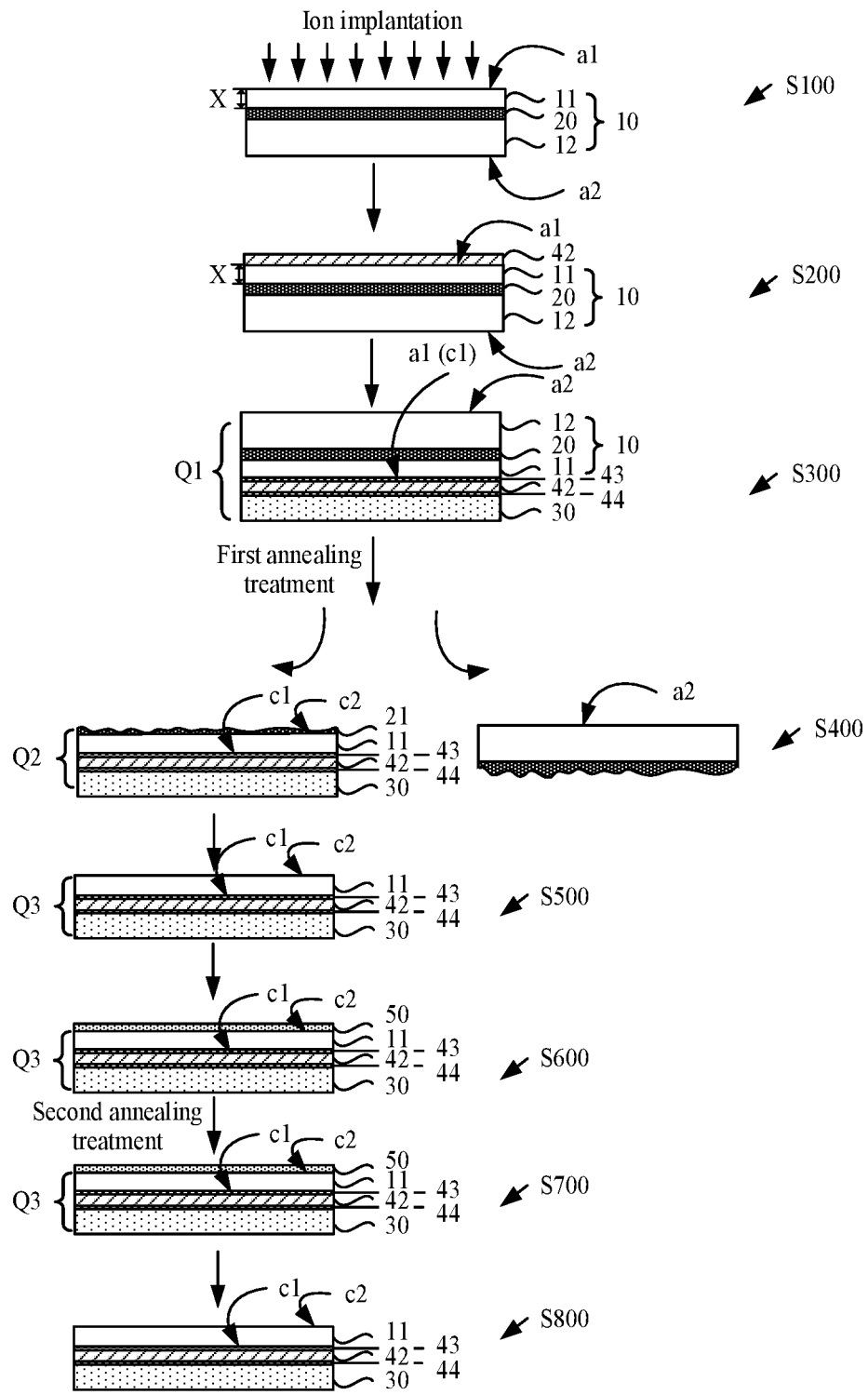
FIG. 7B is a schematic diagram of another composite substrate preparation process according to an embodiment of this application.

S100: As shown in FIG. 7B, perform hydrogen ion implantation on a monocrystalline silicon carbide ingot 10 from a back surface a1 of the monocrystalline silicon carbide ingot 10, so that an implanted ion reaches a preset depth X and forms a defect layer 20 at the preset depth, where a first silicon carbide layer 11 is formed on a side of the defect layer 20 facing the back surface a1 of the monocrystalline silicon carbide ingot 10.

To be specific, a part that is in the monocrystalline silicon carbide ingot 10 and that is located on a side of the defect layer 20 facing the back surface a1 of the monocrystalline silicon carbide ingot 10 is used as the first silicon carbide layer 11.

Step S100 may be the same as step S10 in Example 1. Refer to the foregoing related descriptions. Details are not described herein again.

S200: As shown in FIG. 7B, form a transition layer 42 on the back surface a1 of the monocrystalline silicon carbide ingot 10.

Alternatively, step S200 is not performed, and the following step S200' is performed.

Alternatively, step S200 and step S200' are performed at the same time.

S200': Form the transition layer 42 on a front surface b2 of a second silicon carbide layer 30.

For example, the transition layer 42 may be formed by using a sputtering process.

A material of the transition layer 42 may include, for example, an insulation medium such as $SiO_2$ (silicon oxide), $Si_3N_4$ (silicon nitride), or $Al_2O_3$ (aluminum oxide), or a conductive medium such as Si (silicon) or SiC (silicon carbide), or metal such as Al (aluminum), Cu (copper), Pt (platinum), Ni (nickel), Ti (titanium), Au (gold), and Cr (chromium), or a composite multilayer material that includes a plurality of the foregoing materials.

S300: As shown in FIG. 7B, bond the back surface a1 of the monocrystalline silicon carbide ingot 10 to the front surface b2 of the second silicon carbide layer 30 by using the transition layer 42 to form a first composite structure Q1.

When the back surface a1 of the monocrystalline silicon carbide ingot 10 is bonded to the transition layer 42, a second bonding layer 43 is naturally formed. When the front surface b2 of the second silicon carbide layer 30 is bonded to the transition layer 42, a third bonding layer 44 is naturally formed.

In view of this, it may be understood that the first composite structure Q1 includes the monocrystalline silicon carbide ingot 10, the second bonding layer 43, the transition layer 42, the third bonding layer 44, and the second silicon carbide layer 30.

In some embodiments, a sum of thicknesses of the transition layer 42, the second bonding layer 43, and the third bonding layer 44 is less than or equal to 100 nm. For example, the sum of thicknesses of the transition layer 42, the second bonding layer 43, and the third bonding layer 44 may be 90 nm, 80 nm, 70 nm, or 60 nm.

An excessively large sum of thicknesses of the transition layer 42, the second bonding layer 43, and the third bonding layer 44 may affect electrical conductivity and thermal conductivity of a composite substrate. Therefore, the sum of thicknesses of the transition layer 42, the second bonding layer 43, and the third bonding layer 44 is controlled to be less than or equal to 100 nm, and the sum of thicknesses of the transition layer 42, the second bonding layer 43, and the third bonding layer 44 is reduced as much as possible while ensuring that the back surface a1 of the monocrystalline silicon carbide ingot 10 is stably bonded to the front surface b2 of the second silicon carbide layer 30.

It can be learned from descriptions of Example 1 that the sum of thicknesses of the transition layer 42, the second bonding layer 43, and the third bonding layer 44 may be controlled by controlling duration of bonding the back surface a1 of the monocrystalline silicon carbide ingot 10 to the front surface b2 of the second silicon carbide layer 30.

S400: As shown in FIG. 7B, perform first annealing treatment on the first composite structure Q1, so that the first silicon carbide layer 11 is peeled off along the defect layer 20 to form a second composite structure Q2.

For a process of performing the first annealing treatment on the first composite structure Q1, refer to descriptions of step S30 in Example 1. A difference lies in that the obtained second composite structure Q2 includes a damaged layer 21 separated from the defect layer 20, and the first silicon carbide layer 11, the transition layer 42, and second silicon carbide layer 30 that are bonded.

S500: As shown in FIG. 7B, perform treatment on a surface (a front surface c2) of the first silicon carbide layer 11 away from the second silicon carbide layer 30, to remove the damaged layer 21, and form a third composite structure Q3.

For a process of performing treatment on the front surface c2 of the first silicon carbide layer 11, refer to descriptions of step S40 in Example 1. A difference lies in that the obtained third composite structure Q3 includes the first silicon carbide layer 11, the transition layer 42, and the second silicon carbide layer 30 that are bonded.

S600: As shown in FIG. 7B, form a carbon protective film 50 on the surface (the front surface c2) of the first silicon carbide layer 11 away from the second silicon carbide layer 30.

Step S600 may be the same as step S50 in Example 1. Refer to the related descriptions. Details are not described herein again.

S700: As shown in FIG. 7B, perform second annealing treatment on the third composite structure Q3, to repair a defect caused by hydrogen ion implantation in the first silicon carbide layer 11.

Step S700 may be the same as step S60 in Example 1. Refer to the related descriptions. Details are not described herein again.

S800: As shown in FIG. 7B, remove the carbon protective film 50 to obtain a composite substrate 100.

Step S800 may be the same as step S70 in Example 1. Refer to the related descriptions. Details are not described herein again. A difference lies in that the obtained composite substrate further includes the transition layer 42, and the transition layer 42 is located between a back surface c1 of the first silicon carbide layer 11 and the front surface b2 of the second silicon carbide layer 30.

The following describes the composite substrate preparation method provided in this example by using a specific embodiment as an example.

A composite substrate preparation method includes the following processes.

Hydrogen ion implantation is performed from a back surface of an N-type monocrystalline silicon carbide ingot 10 with a lattice direction deflected by 4° from a <0001> lattice direction to a <11$\bar{2}$0> lattice direction, to form a defect layer 20 at a position of a preset depth X under the back surface.

A temperature of hydrogen ion implantation is room temperature, energy of hydrogen ion implantation is 200 keV, a dose of hydrogen ion implantation is 1e17 $cm^{-2}$, and an angle of hydrogen ion implantation is 7°.

Cleaning with a chemical agent and drying are performed on the back surface of the monocrystalline silicon carbide ingot 10 and a front surface b2 of a second silicon carbide layer 30 with the same specifications. Then, Ar, $N_2$, or $O_2$ plasma activation is performed on the back surface a1 of the monocrystalline silicon carbide ingot 10 and the front surface b2 of the second silicon carbide layer 30. A 2 nm Pt layer is deposited on the front surface b2 of the second silicon carbide layer 30 by using a sputtering process. Then, the back surface a1 of the monocrystalline silicon carbide ingot 10 is bonded to the front surface b2 of the second silicon carbide layer 30 by using the platinum layer at a high temperature of 500° C. and in an $N_2$ environment, to form a first composite structure Q1.

Bonding pressure is 10 kN, and bonding duration is 60 min.

The first composite structure Q1 is placed into a high temperature annealing furnace for annealing in a laser heating and fast thermal annealing manner. In a protective environment with $N_2$, the first composite structure Q1 is annealed for 60 min at an annealing temperature of 1100° C., and then removed from the furnace after cooling. The monocrystalline silicon carbide ingot 10 is automatically peeled off along the defect layer 20 to form a second composite structure Q2.

Dry polishing is first performed on the surface by using an 8000 # grinding wheel, until roughness of the surface is 10 nm. Then, CMP is performed on the surface for grinding, so that the roughness of the surface of the first silicon carbide layer 11 is less than or equal to 0.5 nm.

Sputtering is performed on the surface of the first silicon carbide layer 11 away from the second silicon carbide layer 30 to form a 20 nm carbon protective film 50. In a vacuum environment and an annealing environment at 1650° C., a third composite structure is annealed for 30 min and then removed from the furnace. Then, the carbon protective film 50 is completely etched by using oxygen-containing plasma to form a composite substrate that meets a requirement for epitaxial growth.

Figure 8A:
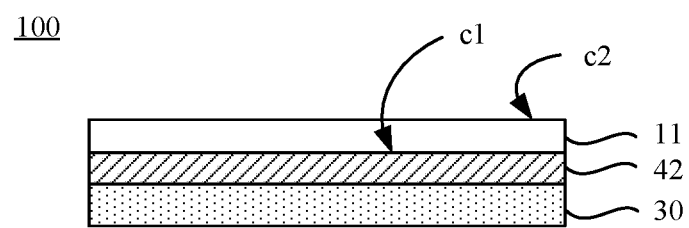
FIG. 8A is a diagram of a structure of another composite substrate according to an embodiment of this application.

In view of this, as shown in FIG. 8A, an embodiment of this application provides a composite substrate 100, including a first silicon carbide layer 11, a second silicon carbide layer 30, and a transition layer 42.

The transition layer 42 is located between the first silicon carbide layer 11 and the second silicon carbide layer 30. The first silicon carbide layer 11 and the second silicon carbide layer 30 are bonded by using the transition layer 42.

Figure 8B:
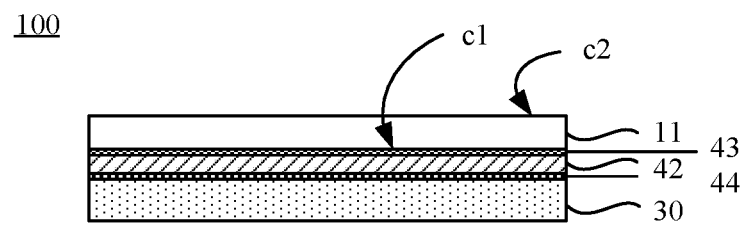
FIG. 8B is a diagram of a structure of still another composite substrate according to an embodiment of this application.

For example, as shown in FIG. 8B, the first silicon carbide layer 11 is bonded to the transition layer 42 to form a second bonding layer 43, and the second silicon carbide layer 30 is bonded to the transition layer 42 to form a third bonding layer 44.

According to the composite substrate preparation method provided in embodiments of this application, hydrogen ion implantation is performed on a high-quality monocrystalline silicon carbide ingot 10 to form an implanted defect layer 20, and then the implanted defect layer is bonded to a low-quality second silicon carbide layer 30. Under an action of high temperature annealing on a bonded composite structure, a composite structure including the low-quality second silicon carbide layer 30 and the high-quality first silicon carbide layer 11 and a high-quality remaining monocrystalline silicon carbide ingot 12 are formed. After being polished, the remaining monocrystalline silicon carbide ingot 12 may be reused as a monocrystalline silicon carbide ingot 10. The composite structure may be used as a composite substrate for epitaxial use after surface polishing and high temperature annealing. In this way, the composite substrate obtained according to the composite substrate preparation method provided in embodiments of this application includes the first silicon carbide layer 11 and the second silicon carbide layer 30 that are disposed in a stacked manner, and the first silicon carbide layer 11 and the second silicon carbide layer 30 belong to a same type of material. Therefore, compared with a composite substrate including a heterogeneous material disposed in a stacked manner, the composite substrate in embodiments of this application has good electrical conductivity and thermal conductivity, and can meet an epitaxial requirement as a monocrystalline silicon carbide substrate does.

In addition, the high-quality monocrystalline silicon carbide ingot 10 is cut in a hydrogen ion implantation manner, which can effectively reduce a cutting loss and improve a yield rate and cutting efficiency. Therefore, according to the composite substrate preparation method provided in embodiments of this application, utilization of the high-quality silicon carbide ingot can be improved, and costs are reduced. The second silicon carbide layer 30 in the composite substrate 100 is a low-quality silicon carbide layer. In other words, the composite substrate in embodiments of this application can utilize low-quality silicon carbide, and improve utilization of the low-quality silicon carbide. Therefore, the composite substrate 100 provided in embodiments of this application can utilize both high-quality silicon carbide and the low-quality silicon carbide, greatly improve overall utilization of silicon carbide, and effectively reduce costs of the composite substrate.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A composite substrate, comprising:
   a first silicon carbide layer comprising monocrystalline silicon carbide, wherein the first silicon carbide layer is formed by performing hydrogen ion implantation on a monocrystalline silicon carbide ingot;
   a second silicon carbide layer bonded to the first silicon carbide layer, wherein a front surface of the second silicon carbide layer faces the first silicon carbide layer, wherein the front surface of the second silicon carbide layer is a (0001) crystal face of the second silicon carbide layer, and wherein defect density of at least a part of the second silicon carbide layer is greater than defect density of the first silicon carbide layer; and a transition layer, wherein the transition layer is located between the first silicon carbide layer and the second silicon carbide layer, wherein a second bonding layer is formed by bonding the first silicon carbide layer to the transition layer and a third bonding layer is formed by bonding the second silicon carbide layer to the transition layer, and wherein a sum of thicknesses of the transition layer, the second bonding layer, and the third bonding layer is less than or equal to 100 nm.

2. The composite substrate according to claim 1, wherein the first silicon carbide layer is directly bonded to the second silicon carbide layer.

3. The composite substrate according to claim 2, wherein a thickness of a first bonding layer formed by directly bonding the first silicon carbide layer to the second silicon carbide layer is less than or equal to 5 nm.

4. The composite substrate according to claim 1, wherein the second silicon carbide layer comprises monocrystalline silicon carbide or polycrystalline silicon carbide.

5. The composite substrate according to claim 1, wherein a thickness of the first silicon carbide layer is less than or equal to 350 μm or a thickness of the second silicon carbide layer is less than or equal to 3000 μm.

6. A semiconductor device, comprising a composite substrate and a switch functional assembly, wherein the composite substrate comprising:

a first silicon carbide layer comprising monocrystalline silicon carbide, wherein the first silicon carbide layer is formed by performing hydrogen ion implantation on a monocrystalline silicon carbide ingot;

a second silicon carbide layer bonded to the first silicon carbide layer, wherein a front surface of the second silicon carbide layer faces the first silicon carbide layer, wherein the front surface of the second silicon carbide layer is a (0001) crystal face of the second silicon carbide layer, wherein defect density of at least a part of the second silicon carbide layer is greater than defect density of the first silicon carbide layer, and wherein the switch functional assembly is disposed on the composite substrate; and a transition layer, wherein the transition layer is located between the first silicon carbide layer and the second silicon carbide layer, wherein a second bonding layer is formed by bonding the first silicon carbide layer to the transition layer and a third bonding layer is formed by bonding the second silicon carbide layer to the transition layer, and wherein a sum of thicknesses of the transition layer, the second bonding layer, and the third bonding layer is less than or equal to 100 nm.

7. The composite substrate according to claim 1, wherein roughness of a surface of the first silicon carbide layer away from the second silicon carbide layer is less than or equal to 0.5 nm.

8. The semiconductor device according to claim 6, wherein the first silicon carbide layer is directly bonded to the second silicon carbide layer.

9. The semiconductor device according to claim 8, wherein a thickness of a first bonding layer formed by directly bonding the first silicon carbide layer to the second silicon carbide layer is less than or equal to 5 nm.

10. The semiconductor device according to claim 6, wherein roughness of a surface of the first silicon carbide layer away from the second silicon carbide layer is less than or equal to 0.5 nm.

11. The semiconductor device according to claim 6, wherein the second silicon carbide layer comprises monocrystalline silicon carbide or polycrystalline silicon carbide.

12. The semiconductor device according to claim 6, wherein a thickness of the first silicon carbide layer is less than or equal to 350 μm or a thickness of the second silicon carbide layer is less than or equal to 3000 μm.

* * * * *